(12) United States Patent
Choi

(10) Patent No.: US 12,057,729 B2
(45) Date of Patent: Aug. 6, 2024

(54) METHOD FOR CONTROLLING BATTERY POWER LIMIT VALUE

(71) Applicant: LG ENERGY SOLUTION, LTD., Seoul (KR)

(72) Inventor: Hae In Choi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 17/950,625

(22) Filed: Sep. 22, 2022

(65) Prior Publication Data

US 2023/0049423 A1 Feb. 16, 2023

Related U.S. Application Data

(62) Division of application No. 16/765,387, filed as application No. PCT/KR2018/011824 on Oct. 8, 2018, now Pat. No. 11,482,875.

(30) Foreign Application Priority Data

Nov. 20, 2017 (KR) .................. 10-2017-0155076

(51) Int. Cl.
*H02J 7/00* (2006.01)
*G01R 31/36* (2020.01)

(52) U.S. Cl.
CPC .... *H02J 7/007182* (2020.01); *G01R 31/3648* (2013.01); *H02J 7/0013* (2013.01); *H02J 7/00302* (2020.01)

(58) Field of Classification Search
CPC .............. H02J 7/007182; H02J 7/0013; H02J 7/00302; G01R 31/3648; Y02E 60/10; H01M 10/44

(Continued)

(56) References Cited

U.S. PATENT DOCUMENTS 7,487,851 B2 * 2/2009 Buck .................. H01M 16/006
180/65.265
8,159,188 B2 * 4/2012 Anderson ............. H01M 10/44
320/132

(Continued)

FOREIGN PATENT DOCUMENTS

CN 104092269 A 10/2014
CN 104734285 B 4/2018

(Continued)

OTHER PUBLICATIONS

Extended European Search Report for European Patent Application No. 18879208.9 dated Jul. 28, 2020.

(Continued)

*Primary Examiner* — M Baye Diao
(74) *Attorney, Agent, or Firm* — Birch, Stewart, Kolasch & Birch, LLP

(57) ABSTRACT

A method for setting a charging power limit of a battery when charging the battery, according to an embodiment of the present invention, may include a reference charging power limit setting step in which a referential predetermined charging power limit is set, a real-time charging power limit calculation step in which a real-time charging power limit is calculated in real time according to a current voltage of the battery, a real-time charging power limit setting step in which a charging power limit of the battery is set to the real-time charging power limit calculated in the real-time charging power limit calculation step, and a charging power limit restoring step in which the real-time charging power limit set in the real-time charging power limit setting step is restored to the referential predetermined charging power limit.

15 Claims, 5 Drawing Sheets

(58) Field of Classification Search
USPC .......................................................... 320/134
See application file for complete search history.

(56) References Cited

U.S. PATENT DOCUMENTS

| | | | |
|---|---|---|---|
| 8,400,112 B2 | 3/2013 | Anderson | |
| 8,471,524 B2 * | 6/2013 | Xiao ................... | H02J 7/00712 |
| | | | 320/107 |
| 8,471,624 B2 | 8/2013 | Xiao et al. | |
| 8,527,784 B2 * | 9/2013 | Nakashima ........... | H01M 10/44 |
| | | | 713/320 |
| 8,965,721 B2 * | 2/2015 | Paryani ................ | G01R 31/389 |
| | | | 324/426 |
| 9,008,767 B2 * | 4/2015 | Bowers ................ | A61N 1/3925 |
| | | | 607/5 |
| 9,221,346 B2 * | 12/2015 | Kitanaka ................... | H02J 1/12 |
| 10,075,005 B2 * | 9/2018 | Fisher ............... | H02J 7/007182 |
| 11,193,981 B2 * | 12/2021 | Kim ....................... | G01R 27/08 |
| 2006/0284614 A1 | 12/2006 | Kim et al. | |
| 2010/0156363 A1 | 6/2010 | Chiu | |
| 2011/0006733 A1 | 1/2011 | Tatebayashii | |
| 2011/0204850 A1 | 8/2011 | Kaino | |
| 2013/0257155 A1 | 10/2013 | Judkins et al. | |
| 2014/0183938 A1 | 7/2014 | Peswani | |
| 2014/0184136 A1 | 7/2014 | Ture | |
| 2016/0336763 A1 | 11/2016 | Khandelwal et al. | |
| 2016/0344201 A1 | 11/2016 | Masuko | |
| 2017/0126052 A1 | 5/2017 | Toki | |
| 2017/0155254 A1 * | 6/2017 | Katayama ........... | H02J 7/00712 |
| 2017/0271896 A1 | 9/2017 | Zhang | |

FOREIGN PATENT DOCUMENTS

| | | | | |
|---|---|---|---|---|
| EP | 3 046 211 A2 | 7/2016 | | |
| JP | 9-215111 A | 8/1997 | | |
| JP | 2010-41883 A | 2/2010 | | |
| JP | 2010041883 A * | 2/2010 | ............. | Y02E 60/12 |
| JP | 2013-133060 A | 7/2013 | | |
| JP | 2017-108604 A | 6/2017 | | |
| JP | 6187692 B2 | 9/2017 | | |
| JP | 2018-126015 A | 8/2018 | | |
| KR | 10-2010-0073973 A | 7/2010 | | |
| KR | 10-2014-0084512 A | 7/2014 | | |
| KR | 10-2014-0133318 A | 11/2014 | | |
| KR | 10-2014-0139035 A | 12/2014 | | |
| KR | 10-2015-0001982 A | 1/2015 | | |
| KR | 10-1601714 B1 | 3/2016 | | |
| KR | 10-2016-0134572 A | 11/2016 | | |
| KR | 10-2017-0043633 A | 4/2017 | | |
| WO | WO 2017/152180 A1 | 9/2017 | | |

OTHER PUBLICATIONS

International Search Report for PCT/KR2018/011824 (PCT/ISA/210) mailed on Mar. 29, 2019.

* cited by examiner

[Fig. 1]
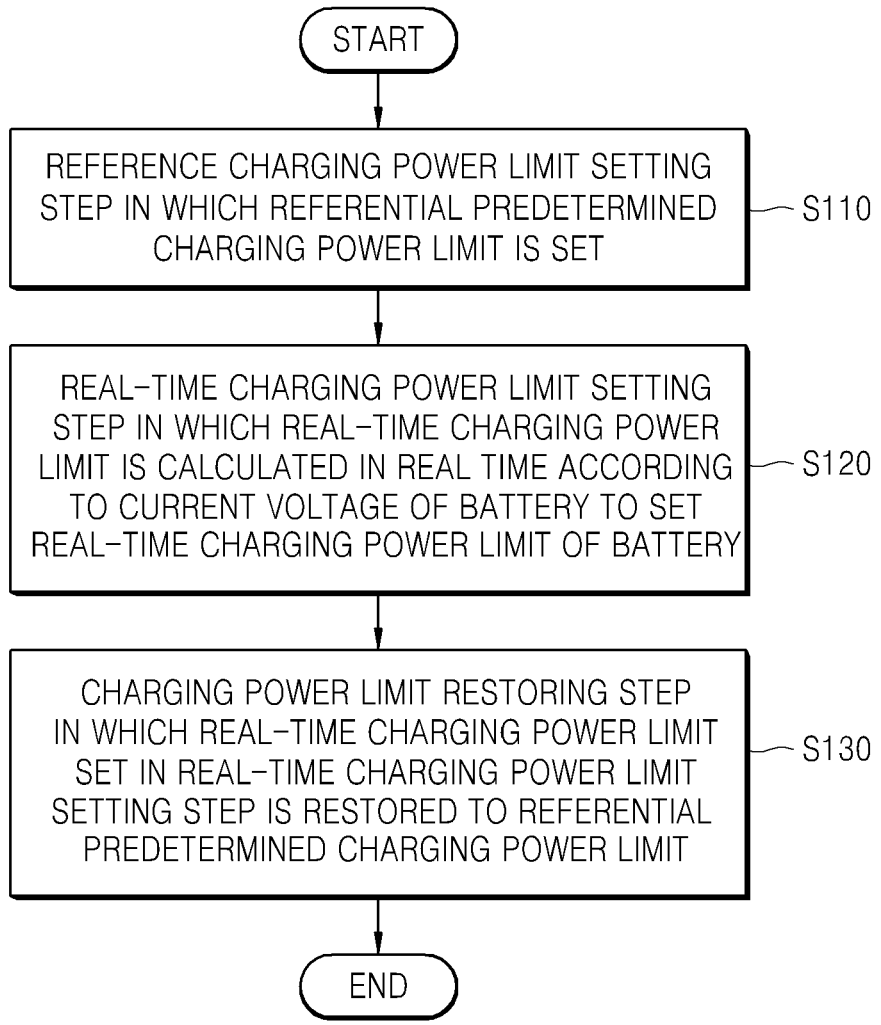

[Fig. 2]
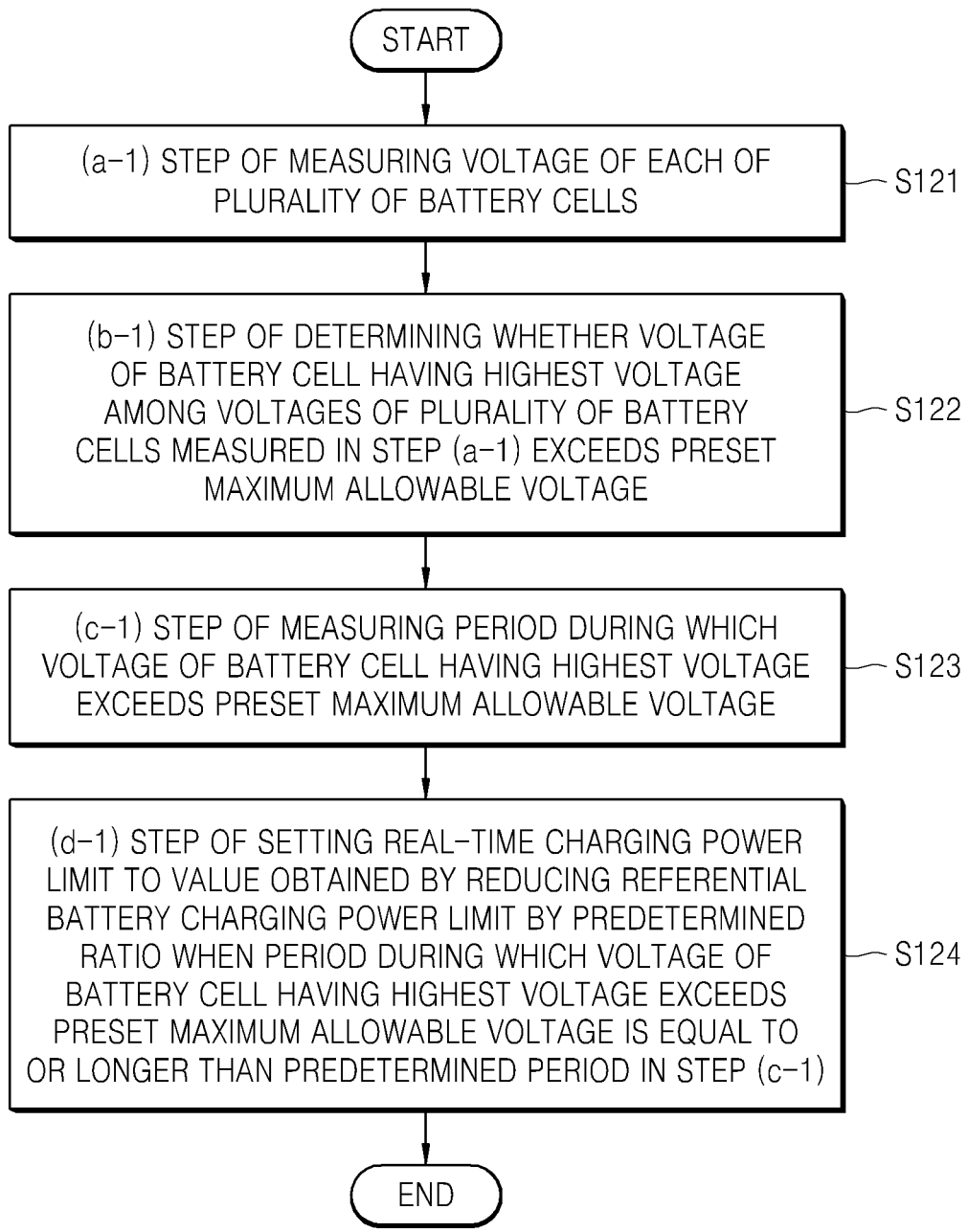

[Fig. 3]
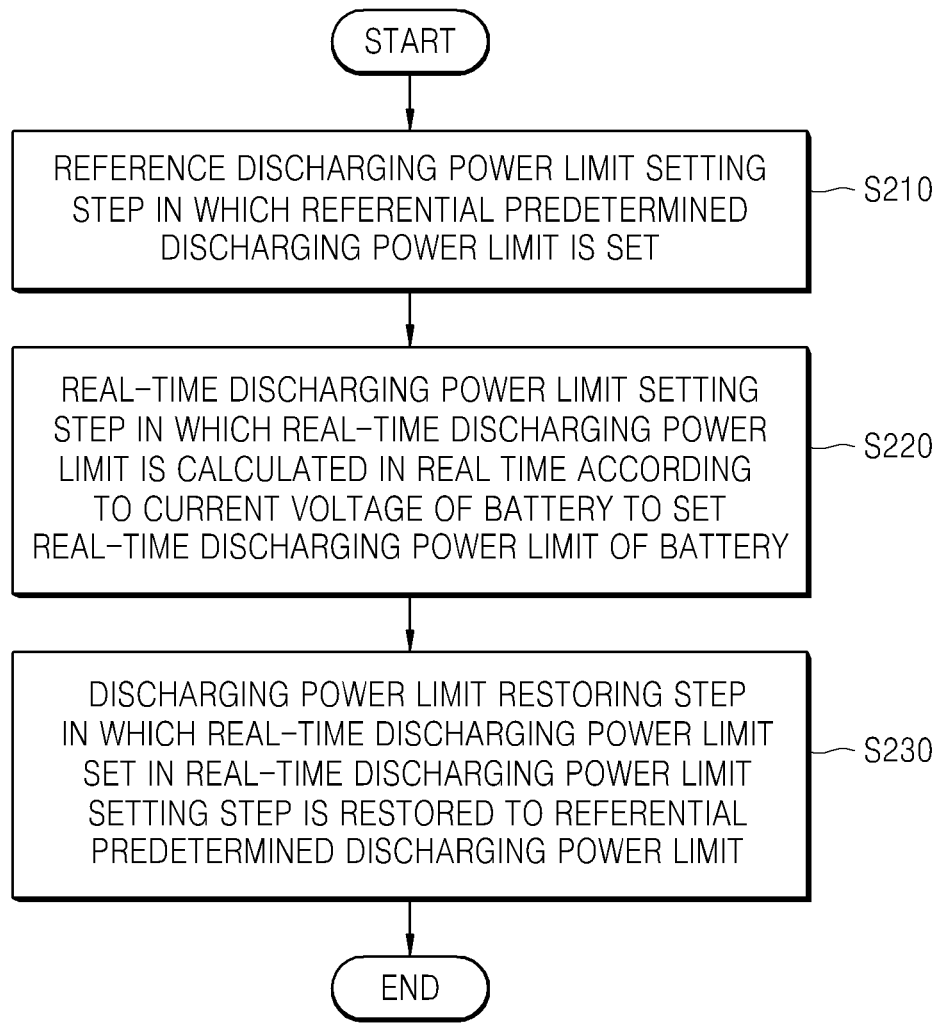

[Fig. 4]
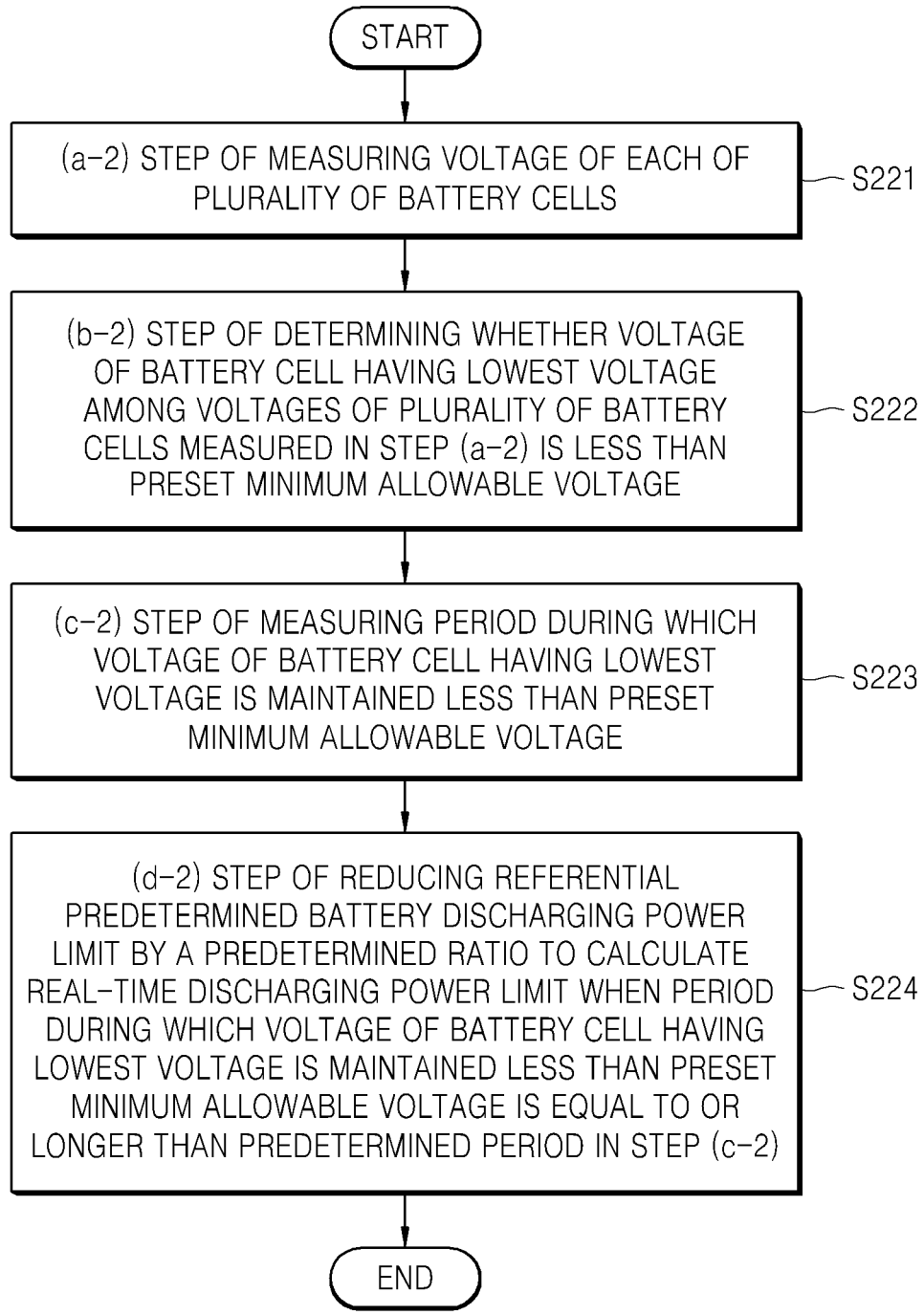

[Fig. 5]
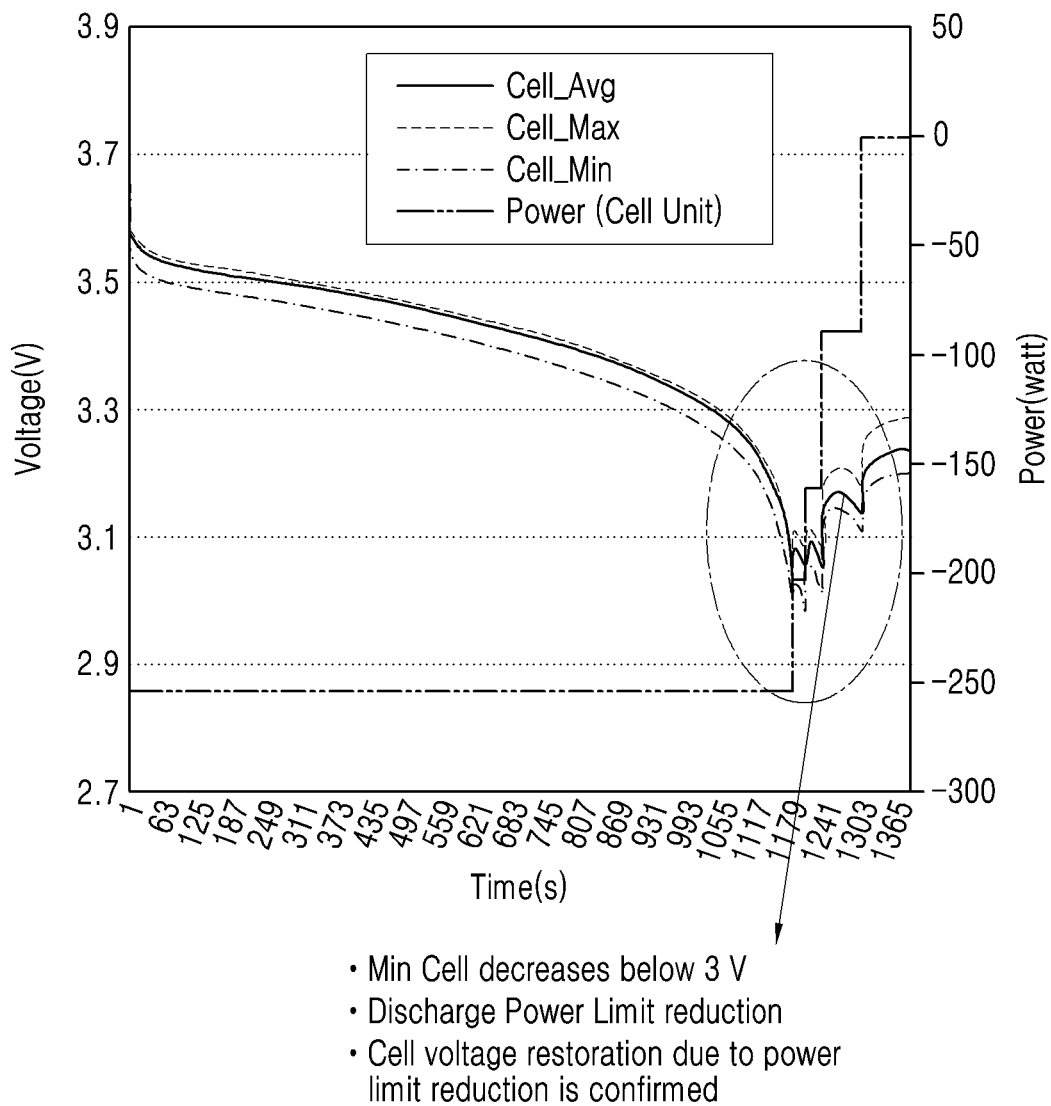
- Min Cell decreases below 3 V
- Discharge Power Limit reduction
- Cell voltage restoration due to power limit reduction is confirmed

METHOD FOR CONTROLLING BATTERY POWER LIMIT VALUE

CROSS-REFERENCE TO RELATED APPLICATIONS

This application is a Divisional of U.S. patent application Ser. No. 16/765,387 filed on May 19, 2020, which is the National Phase under 35 U.S.C. § 371 of International Application No. PCT/KR2018/011824, filed on Oct. 8, 2018, which claims priority to Korean Patent Application No. 10-2017-0155076 filed on Nov. 20, 2017, the entire contents of which are hereby expressly incorporated by reference into the present application.

TECHNICAL FIELD

The present invention relates to a method for controlling a battery power limit.

More specifically, the present invention relates to a method for controlling a battery power limit on the basis of a current cell voltage.

BACKGROUND ART

In general, battery modules having at least one battery cell are electrically configured in series/parallel to each other, and a battery pack including at least one battery module has a rack battery management system (RBMS) for monitoring and controlling a state of the battery pack. Furthermore, each battery module has a module battery management system (MBMS) for controlling the battery module.

Meanwhile, in a battery pack, battery modules may be connected in series to output high power, or battery modules may be connected in parallel to increase an energy capacity or use time.

With regard to the battery modules conted in series or parallel, a maximum output limit of the battery pack is set according to an SOC and temperature of the battery modules.

Setting the maximum output limit of a battery pack by measuring a temperature of the battery pack is conventionally performed by setting the maximum output limit of the battery pack simply on the basis of a temperature or by setting the maximum output limit of the battery pack simply through a voltage of the battery pack.

According to the conventional technique of calculating the maximum output value of a battery pack simply on the basis of a battery temperature or a voltage of the battery pack, the maximum output value is calculated using a table including a temperature or battery pack voltage and a battery pack output limit.

In other words, in order to reset the battery pack output limit, an additional table indicating a relationship between a temperature or voltage and a battery pack output limit should be stored.

To solve this problem, the present invention proposes a method in which only a maximum voltage and minimum voltage are checked in real time in battery modules connected in series or parallel and the maximum output limit of an entire battery pack is set on the basis of the maximum voltage and the minimum voltage without using the additional table including a temperature or voltage and a battery pack output limit. (Prior Art Document) Korean Patent Application Laid-open Publication No. 2010-0073973 A

DISCLOSURE OF THE INVENTION

Technical Problem

The present invention provided a method for setting a maximum output limit of a battery pack in real time.

Furthermore, the present invention provided a method for setting a maximum output limit of a battery pack without an additional pre-stored table of a maximum output limit according to a temperature and SOC.

Technical Solution

A method for setting a charging power limit of a battery when charging the battery, the battery including a plurality of battery cells, according to an embodiment of the present invention, includes: a reference charging power limit setting step of setting a referential predetermined charging power limit; a real-time charging power limit setting step of calculating a real-time charging power limit in real-time according to a real-time voltage of the battery and setting a real-time charging power limit of the battery; and a charging power limit restoring step of restoring the real-time charging power limit set in the real-time charging power limit setting step to the referential predetermined charging power limit.

The real-time charging power limit setting step may include: (a-1) a step of measuring a voltage of each of the plurality of battery cells; (b-1) a step of determining whether the voltage of a battery cell having a highest voltage among voltages of the plurality of battery cells measured in step (a-1) exceeds a preset maximum allowable voltage; (c-1) a step of measuring a period during which the voltage of the battery cell having the highest voltage exceeds the preset maximum allowable voltage; and (d-1) a step of setting the real-time charging power limit to a value obtained by reducing the referential predeterminded charging power limit by a predetermined ratio when the period during which the voltage of the battery cell having the highest voltage exceeds the preset maximum allowable voltage is equal to or longer than a predetermined period in step (c-1), wherein steps (a-1) to (d-1) may be repeatedly performed, and the number of times step (d-1) is performed may be counted to generate a counted value.

In step (d-1), the predetermined ratio by which the referential battery charging power limit is reduced may vary according to the counted value, wherein the counted value may be limited to a predetermined value, and when the counted value reaches the predetermined value, charging of the battery may be stopped.

The counted value may increase by 1 every time step (d-1) is performed once, and may decrease by 1 when the battery which is in a charging state switches to a discharging state.

In the charging power limit restoring step, the real-time charging power limit may be restored to the referential predetermined charging power limit in any one case among: a case where the counted value is 0; a case where current does not flow in the battery for at least a predetermined time; and a case where an SOC value of the battery reaches a predetermined reference SOC value.

A method for setting a discharging power limit of a battery when discharging the battery, the battery including a plurality of battery cells, according to an embodiment of the present invention, includes: a reference discharging power limit setting step of setting a referential predetermined discharging power limit; a real-time discharging power limit setting step of calculating a real-time discharging power limit in real-time according to a real-time voltage of the battery and setting a real-time discharging power limit of the battery; and a discharging power limit restoring step of restoring the real-time discharging power limit set in the real-time discharging power limit setting step to the referential predetermined discharging power limit.

The real-time discharging power limit setting step may include: (a-2) a step of measuring a voltage of each of the plurality of battery cells; (b-2) a step of determining whether the voltage of a battery cell having a lowest voltage among voltages of the plurality of battery cells measured in step (a-2) is less than a preset minimum allowable voltage; (c-2) a step of measuring a period during which the voltage of the battery cell having the lowest voltage is maintained less than the preset minimum allowable voltage; and (d-2) a step of reducing the referential predetermined battery discharging power limit by a predetermined ratio to calculate the real-time discharging power limit when the period during which the voltage of the battery cell having the lowest voltage is maintained less than the preset minimum allowable voltage is equal to or longer than a predetermined period, wherein steps (a-2) to (d-2) may be repeatedly performed, and the number of times step (d-2) is performed may be counted to generate a counted value.

In step (d-2), the predetermined ratio by which the referential battery charging power limit is reduced may vary according to the counted value, wherein the counted value may be limited to a predetermined value, and when the counted value reaches the predetermined value, discharging of the battery may be stopped.

The counted value may increase by 1 every time step (d-2) is performed once, and may decrease by 1 when the battery which is in a discharging state switches to a charging state.

In the charging power limit restoring step, the real-time discharging power limit may be restored to the referential predetermined discharging power limit in any one case among: a case where the counted value is 0; a case where current does not flow in the battery for at least a predetermined time; and a case where an SOC value of the battery reaches a predetermined reference SOC value.

Advantageous Effects

According to the present invention, a maximum output limit of a battery pack may be set in real time.

Furthermore, a maximum output limit of a battery pack may be set without an additional pre-stored table of a maximum output limit according to a temperature and SOC.

BRIEF DESCRIPTION OF THE DRAWINGS

FIG. 1 is a flowchart illustrating a method for setting a battery charging power limit at the time of charging according to an embodiment of the present invention.

FIG. 2 is a detailed flowchart illustrating a real-time charging power limit setting step of the method for setting a battery charging power limit at the time of charging according to an embodiment of the present invention.

FIG. 3 is a flowchart illustrating a method for setting a battery discharging power limit at the time of discharging according to an embodiment of the present invention.

FIG. 4 is a detailed flowchart illustrating a real-time charging power limit setting step of the method for setting a battery discharging power limit at the time of discharging according to an embodiment of the present invention.

FIG. 5 is a graph illustrating that a voltage of a battery cell is restored by setting a battery discharging power limit at the time of discharging according to an embodiment of the present invention.

MODE FOR CARRYING OUT THE INVENTION

Hereinafter, embodiments of the present invention will be described in detail with reference to the accompanying drawings so that those skilled in the art can easily carry out the present invention. However, the present invention may be implemented in various different forms and is not limited to the embodiments described herein. Some parts of the embodiments, which are not related to the description, are not illustrated in the drawings in order to clearly describe the embodiments of the present invention. Like reference numerals refer to like elements throughout the description.

The term "first", "second" or the like may be used for describing various elements but does not limit the elements. Such terms are only used for distinguishing one element from other elements. For example, without departing the scope of the present invention, a first element may be referred to as a second element, and likewise, a second element may be referred to as a first element. The terminology used herein is not for delimiting the present invention but for describing specific embodiments. The terms of a singular form may include plural forms unless otherwise specified.

In the entire description, when one part is referred to as being "connected" to another part, the former may be "directly connected" to the latter or "electrically connected" thereto via an intervening other part. When it is mentioned that a certain part "includes" or "comprises" certain elements, the part may further include other elements, unless otherwise specified. The term "step (ing) . . . " or "step of . . . " used herein does not represent "step for . . . ".

The terms used herein have been selected from among general terms that are widely used at the present time in consideration of the functions of the present invention, but may be changed depending on intentions of those skilled in the art, judicial precedents, or the advent of new technology. Furthermore, specific terms have been arbitrarily selected by the applicant, and the meanings of such terms will be described in detail in relevant sections of the description. Therefore, it should be understood that the terms used herein should not be simply defined literally but should be defined on the basis of the meanings of the terms and the overall contents of the present disclosure.

1. Method for setting a battery power limit at the time of charging according to an embodiment of the present invention FIG. 1 is a flowchart illustrating the method for setting a battery charging power limit at the time of charging according to an embodiment of the present invention.

FIG. 2 is a detailed flowchart illustrating a real-time charging power limit setting step of the method for setting a battery charging power limit at the time of charging according to an embodiment of the present invention.

The method for setting a battery power limit at the time of charging according to an embodiment of the present invention will be described with reference to FIGS. 1 and 2.

The method for setting a battery power limit at the time of charging according to an embodiment of the present invention may include a reference charging power limit setting step in which a referential predetermined charging power limit is set (S110), a real-time charging power limit setting step in which a real-time charging power limit is calculated in real time according to a current voltage of a battery to set a real-time charging power limit of the battery (S120), and a charging power limit restoring step in which the real-time charging power limit set in the real-time charging power limit setting step is restored to the referential predetermined charging power limit (S130).

In detail, the battery may include a plurality of battery cells, and the reference charging power limit setting step may be set to a predetermined value according to specifications of each of the plurality of battery cells included in the battery and entire battery specifications when designing the battery.

Meanwhile, the real-time charging power limit setting step (S120) may include (a-1) a step of measuring a voltage of each of the plurality of battery cells (S121), (b-1) a step of determining whether the voltage of a battery cell having a highest voltage exceeds a preset maximum allowable voltage (S122), (c-1) a step of measuring a time during which the voltage of the battery cell having the highest voltage exceeds the preset maximum allowable voltage (S123), (d-1) a step of setting the real-time charging power limit to a value obtained by reducing the referential battery charging power limit by a predetermined ratio when a period during which the voltage of the battery cell having the highest voltage exceeds the preset maximum allowable voltage is equal to or longer than a predetermined period in step (c-1) (S124).

Meanwhile, in the real-time charging power limit setting step (S120), steps (a-1) to (d-1) may be repeatedly performed.

Meanwhile, the period during which the voltage of the battery cell having the highest voltage exceeds the preset maximum allowable voltage may be measured from a point of time at which the voltage of the battery cell initially exceeds the preset maximum allowable voltage.

Hereinafter, the real-time charging power limit setting step will be described with a specific embodiment. Step (b-1) may be a step of determining whether the voltage of the battery cell having the highest voltage, among the plurality of battery cells, exceeds 4.2 V. In step (c-1), when there is a battery cell having a voltage which exceeds 4.2 V in step (b-1), a period during which the voltage of the battery cell exceeds 4.2 V may be measured. Meanwhile, in step (d-1), when the period during which the voltage of the battery cell exceeds 4.2 V is at least 5 seconds, the battery charging power limit may be reset.

Meanwhile, in the real-time charging power limit setting step, the number of times step (d-1) is performed is counted by a counting module to generate a counted value.

Meanwhile, in step (d-1), the predetermined ratio by which the referential battery charging power limit is reduced varies according to the counted value, wherein the counted value is limited to a predetermined value, and when the counted value reaches the predetermined value, charging of the battery may be stopped.

In detail, the predetermined ratio according to the counted value may be calculated using the following equation.

$$\text{Predetermined ratio} = 0.8^{counted\ value}$$

Furthermore, the predetermined value to which the counted value is limited may be 10.

In other words, when the counted value is limited to 10, the predetermined ratio is $0.8^{10}$ according to the above equation, and may be about 1/10 of the reference charging power limit of a battery pack.

Meanwhile, the counted value may increase by 1 every time step (d-1) is performed once, and may decrease by 1 every time the battery which is in a charging state switches to a discharging state.

Meanwhile, in the charging power limit restoring step, the battery charging power limit may be restored to the referential predetermined charging power limit in any one case among a case where the counted value is 0, a case where a current does not flow in the battery for at least a predetermined time, and a case where an SOC value of the battery reaches a predetermined reference SOC value.

On the basis of the above description, the method for setting a battery charging power limit at the time of charging according to an embodiment of the present invention may easily calculate the charging power limit of the battery pack without an additional table in which a temperature or voltage and a charging power limit are set.

That is, without storing an additional table in which a temperature or voltage and a charging power limit are set, the charging power limit of the battery pack may be set. Furthermore, without directly measuring a temperature of the battery pack, the charging power limit of the battery pack may be calculated.

2. Method for setting a battery discharging power limit at the time of discharging according to an embodiment of the present invention.

FIG. 3 is a flowchart illustrating the method for setting a battery discharging power limit at the time of discharging according to an embodiment of the present invention.

FIG. 4 is a detailed flowchart illustrating a real-time charging power limit setting step of the method for setting a battery discharging power limit at the time of discharging according to an embodiment of the present invention.

The method for setting a battery discharging power limit at the time of discharging according to an embodiment of the present invention will be described with reference to FIGS. 3 and 4.

The method for setting a battery discharging power limit at the time of discharging according to an embodiment of the present invention may include a reference discharging power limit setting step in which a referential predetermined discharging power limit is set (S210), a real-time discharging power limit setting step in which a real-time discharging power limit is calculated in real time according to a current voltage of a battery to set a real-time discharging power limit of the battery (S220), and a discharging power limit restoring step in which the real-time discharging power limit set in the real-time discharging power limit setting step is restored to the referential predetermined discharging power limit (S230).

In detail, the battery may include a plurality of battery cells, and the reference discharging power limit setting step may be set to a predetermined value according to specifications of each of the plurality of battery cells included in a battery pack and entire battery pack specifications when designing the battery pack.

Meanwhile, the real-time discharging power limit setting step (S220) may include (a-2) a step of measuring a voltage of each of the plurality of battery cells (S221), (b-2) a step of determining whether the voltage of a battery cell having a lowest voltage, among the plurality of battery cells, is less than a preset minimum allowable voltage (S222), (c-2) a step of measuring a time during which the voltage of the battery cell having the lowest voltage is less than the preset minimum allowable voltage (S223), (d-2) a step of reducing the referential battery discharging power limit by a prescribed ratio to calculate the real-time discharging power limit when a period during which the voltage of the battery cell having the lowest voltage is less than the preset minimum allowable voltage is equal to or longer than a predetermined period in step (c-2) (S224).

Meanwhile, in the real-time discharging power limit setting step (S220), steps (a-2) to (d-2) may be repeatedly performed.

Meanwhile, the period during which the voltage of the battery cell having the lowest voltage is less than the preset minimum allowable voltage may be measured from a point of time at which the voltage of the battery cell is initially less than the preset minimum allowable voltage.

Hereinafter, the real-time discharging power limit setting step will be described with a specific embodiment. Step (b-2) may be a step of determining whether the voltage of the battery cell having the lowest voltage, among the plurality of battery cells, is less than 3.0 V. In step (c-2), when there is a battery cell having a voltage which is less than 3.0 V in step (b-2), a time during which the voltage of the battery cell is less than 3.0 V may be measured. Meanwhile, in step (d-2), when the time during which the voltage of the battery cell is less than 3.0 V is at least 5 seconds, the battery discharging power limit may be reset.

Meanwhile, in the real-time discharging power limit setting step, the number of times step (d-2) is performed is counted by a counting module to generate a counted value.

Meanwhile, in step (d-2), the predetermined ratio by which the referential battery discharging power limit is reduced varies according to the counted value, wherein the counted value is limited to a predetermined value, and when the counted value reaches a predetermined value, discharging of the battery may be stopped.

In detail, the predetermined ratio according to the counted value may be calculated using the following equation.

$$\text{Predetermined ratio} = 0.8^{counted\ value}$$

Furthermore, the predetermined value to which the counted value is limited may be 10.

In other words, when the counted value is limited to 10, the predetermined ratio is $0.8^{10}$ according to the above equation, and may be about 1/10 of the reference discharging power limit of a battery pack.

Meanwhile, the counted value may increase by 1 every time step (c-2) is performed once, and may decrease by 1 every time the battery which is in a discharging state switches to a charging state.

Meanwhile, in the discharging power limit restoring step, the battery discharging power limit may be restored to the referential predetermined discharging power limit in any one case among a case where the counted value is 0, a case where a current does not flow in the battery for at least a predetermined time, and a case where an SOC value of the battery reaches a predetermined reference SOC value.

The methods and/or steps of the present invention recited above may be part of a control strategy programmed into one or more controllers, such as a module battery management system (MBMS).

On the basis of the above description, the method for setting a battery discharging power limit at the time of discharging according to an embodiment of the present invention may easily calculate the discharging power limit of the battery pack without an additional table in which a temperature or voltage and a discharging power limit are set.

That is, without storing an additional table in which a temperature or voltage and a discharging power limit are set, the discharging power limit of the battery pack may be set.

Furthermore, without directly measuring a temperature of the battery pack, the discharging power limit of the battery pack may be calculated.

Furthermore, referring to FIG. 5, when the discharging power limit of the battery is reduced, a cell voltage is restored, and thus the use time of the battery may increase.

Although the method for controlling battery power limit has been described with reference to the specific embodiments, it is not limited thereto. Therefore, it will be readily understood by those skilled in the art that various modifications and changes can be made thereto without departing from the spirit and scope of the present invention defined by the appended claims.

What is claimed is:

1. A method for setting a discharging power limit of a battery when discharging the battery, wherein the battery includes a plurality of battery cells, the method being part of a control strategy programmed into a module battery management system (MBMS), the method comprising:
   a reference discharging power limit setting operation, via the MBMS, of setting a referential predetermined discharging power limit; and
   a real-time discharging power limit setting operation, via the MBMS, of calculating a real-time discharging power limit in real-time according to a real-time voltage of the battery and setting a real-time discharging power limit of the battery,
   wherein the real-time voltage of the battery is determined, via the MBMS, based on a voltage of one battery cell among the plurality of battery cells.

2. The method of claim 1, further comprising a discharging power limit restoring operation, via the MBMS, of setting the real-time discharging power limit set in the real-time discharging power limit setting operation to the referential predetermined discharging power limit.

3. The method of claim 2, wherein, after the real-time discharging power limit setting operation is performed, in the discharging power limit restoring operation, the real-time discharging power limit is set to the referential predetermined discharging power limit when an SOC (state of charge) value of the battery reaches a predetermined reference SOC value.

4. The method of claim 1, further comprising discharging, via the MBMS, the battery based on the real-time charging power limit.

5. The method of claim 1, wherein the real-time discharging power limit setting operation comprises:
   (a-2) an operation, via the MBMS, of measuring a voltage of each of the plurality of battery cells including the voltage of the one battery cell;
   (b-2) an operation, via the MBMS, of determining whether the voltage the one battery cell having a lowest voltage among voltages of the plurality of battery cells measured in operation (a-2) is less than a preset minimum allowable voltage;
   (c-2) an operation, via the MBMS, of measuring a period during which the voltage of the battery cell having the lowest voltage is maintained less than the preset minimum allowable voltage; and
   (d-2) an operation, via the MBMS, of reducing the referential predetermined battery discharging power limit by a predetermined ratio to calculate the real-time discharging power limit when the period during which the voltage of the battery cell having the lowest voltage is maintained less than the preset minimum allowable voltage is equal to or longer than a predetermined period, wherein operations (a-2) to (d-2) are repeatedly performed, and
wherein a number of times operation (d-2) is performed is counted to generate a counted value.

6. The method of claim 5, wherein, in operation (d-2), the predetermined ratio by which the referential battery discharging power limit is reduced varies according to the counted value, and
wherein the counted value is limited to a predetermined value, and when the counted value reaches the predetermined value, discharging of the battery is stopped.

7. The method of claim 5, wherein the counted value increases by 1 every time operation (d-2) is performed once, and decreases by 1 when the battery which is in a discharging state switches to a charging state.

8. The method of claim 7, wherein, in the discharging power limit restoring operation, the real-time discharging power limit is set to the referential predetermined discharging power limit in any one case among:
a case where the counted value is 0;
a case where current does not flow in the battery for at least a predetermined time; and
a case where an SOC (state of charge) value of the battery reaches a predetermined reference SOC value.

9. The method of claim 5, wherein the predetermined ratio according to the counted value is calculated using the following equation:

Predetermined ratio=$0.8^{counted\ value}$.

10. The method of claim 5, wherein the counted value is limited to 10.

11. The method of claim 5, wherein the predetermined ratio is about 0.810.

12. The method of claim 5, wherein the period in operation (c-2) is at least 5 seconds.

13. The method of claim 1, wherein the calculating of the real-time discharging power limit in the real-time discharging power limit setting operation is performed without directly measuring temperatures of the battery and any of the plurality of battery cells.

14. The method of claim 1, wherein the calculating of the real-time discharging power limit in the real-time charging power limit setting operation is performed without using an additional table in which a temperature or a voltage and the charging power limit of the battery are set.

15. The method of claim 1, wherein the referential predetermined discharging power limit is based on specifications of each of the plurality of battery cells.

* * * * *